(12) United States Patent
Chen et al.

(10) Patent No.: US 10,451,932 B2
(45) Date of Patent: Oct. 22, 2019

(54) FLEXIBLE DISPLAY PANEL, DISPLAY DEVICE ND BONDING METHOD THEREOF

(71) Applicant: BOE TECHNOLOGY GROUP CO., LTD., Beijing (CN)

(72) Inventors: Liqiang Chen, Beijing (CN); Weifeng Zhou, Beijing (CN); Hong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 27 days.

(21) Appl. No.: 15/538,327

(22) PCT Filed: Jun. 20, 2016

(86) PCT No.: PCT/CN2016/086362
§ 371 (c)(1),
(2) Date: Jun. 21, 2017

(87) PCT Pub. No.: WO2017/133161
PCT Pub. Date: Aug. 10, 2017

(65) Prior Publication Data
US 2018/0108636 A1  Apr. 19, 2018

(30) Foreign Application Priority Data

Feb. 4, 2016  (CN) .......................... 2016 1 0080509

(51) Int. Cl.
*G02F 1/1345* (2006.01)
*H01L 23/498* (2006.01)
(Continued)

(52) U.S. Cl.
CPC ........ *G02F 1/1345* (2013.01); *G02F 1/13454* (2013.01); *G02F 1/133305* (2013.01);
(Continued)

(58) Field of Classification Search
CPC .............. H01L 24/50; H01L 23/49838; H01L 23/4985; H01L 27/1218; H01L 27/124;
(Continued)

(56) References Cited

U.S. PATENT DOCUMENTS 6,300,997 B1   10/2001   Saito et al.
6,909,488 B2   6/2005   Kurasawa
(Continued)

FOREIGN PATENT DOCUMENTS

CN    1266200 A    9/2000
CN    1441288 A    9/2003
(Continued)

OTHER PUBLICATIONS

Second Chinese Office Action in Chinese Application No. 201610080509.0, dated Sep. 22, 2017 with English translation.
(Continued)

*Primary Examiner* — Shan Liu
(74) *Attorney, Agent, or Firm* — Collard & Roe, P.C.

(57) ABSTRACT

A flexible display panel, a display device and a bonding method thereof are provided. The flexible display panel includes a plurality of fan-out leads arranged along a first direction and disposed in a fan-out region; virtual extension lines of the fan out leads at least disposed in lateral regions of the fan-out region are intersected at a first junction point on a reference line perpendicular to the first direction; a chip on film includes a plurality of pads being arranged along the first direction and in one-to-one correspondence with the fan-out leads; and virtual extension lines of the pads, which at least correspond to the fan-out leads disposed in the lateral regions, are intersected at a second junction point on the reference line.

8 Claims, 8 Drawing Sheets

(51) Int. Cl.
  H01L 23/00 (2006.01)
  G02F 1/1333 (2006.01)
  H01L 27/12 (2006.01)
(52) U.S. Cl.
  CPC .......... H01L 23/4985 (2013.01); H01L 24/50 (2013.01); H01L 24/80 (2013.01); *H01L 23/49838* (2013.01); *H01L 27/124* (2013.01); *H01L 27/1218* (2013.01); *H01L 2224/80127* (2013.01); *H01L 2224/80129* (2013.01); *H01L 2224/80132* (2013.01); *H01L 2924/00014* (2013.01)
(58) Field of Classification Search
  CPC ............... H01L 23/48; H01L 23/49572; H01L 2224/50; H01L 2224/79; H01L 2224/86; H01L 2225/06579; H01L 2225/107; G02F 1/13454; G02F 1/1345; G02F 1/133305; G02F 1/0121; G02F 1/0327; G02F 1/076; G02F 1/133; G02F 1/13306; G02F 1/13452; G02F 1/13458; G02F 2001/133388; G02F 2001/133612; G02F 2001/13456; G09F 9/30; G09G 2300/0426; G09G 2300/0408; G09G 3/3655; G09G 3/3674; G09G 3/3685; G09G 2290/00; G09G 2320/0223; G09G 2300/0421; G09G 3/36
  USPC .................................................. 349/149–152
  See application file for complete search history.

(56) References Cited

U.S. PATENT DOCUMENTS

| | | | |
|---|---|---|---|
| 9,591,754 B2 | 3/2017 | Lee | |
| 2003/0022558 A1* | 1/2003 | Imaoka | H01L 23/49838 439/660 |
| 2003/0160929 A1* | 8/2003 | Kurasawa | G02F 1/1345 349/149 |
| 2007/0222777 A1* | 9/2007 | Nakazawa | G02F 1/1345 345/205 |
| 2007/0275578 A1* | 11/2007 | Yamada | H05K 1/0269 439/79 |
| 2014/0300649 A1* | 10/2014 | Park | G09G 3/006 345/690 |
| 2014/0321088 A1* | 10/2014 | Bae | H05K 1/117 361/767 |
| 2015/0090990 A1* | 4/2015 | Tsuruoka | H01L 51/0097 257/40 |
| 2015/0366049 A1* | 12/2015 | Lee | G02F 1/13458 361/749 |

FOREIGN PATENT DOCUMENTS

| | | |
|---|---|---|
| CN | 101034213 A | 9/2007 |
| CN | 104123902 A | 10/2014 |
| CN | 105301851 A | 2/2016 |
| CN | 105513499 A | 4/2016 |
| CN | 105551378 A | 5/2016 |
| CN | 105609007 A | 5/2016 |
| CN | 205376003 U | 7/2016 |
| JP | 2007-242942 A | 9/2007 |

OTHER PUBLICATIONS

International Search Report of PCT/CN2016/086362 in Chinese, dated Nov. 11, 2016 with English translation.
Notice of Transmittal of the International Search Report of PCT/CN2016/086362 in Chinese, dated Nov. 11, 2016.
Written Opinion of the International Searching Authority of PCT/CN2016/086362 in Chinese, dated Nov. 11, 2016 with English translation.
Chinese Office Action in Chinese Application No. 201610080509.0, dated Apr. 17, 2017 with English translation.

* cited by examiner

FLEXIBLE DISPLAY PANEL, DISPLAY DEVICE ND BONDING METHOD THEREOF

CROSS REFERENCE TO RELATED APPLICATIONS

This application is the National Stage of PCT/CN2016/086362 filed on Jun. 20, 2016, which claims priority under 35 U.S.C. § 119 of Chinese Application No. 201610080509.0 filed on Feb. 4, 2016, the disclosure of which is incorporated by reference.

TECHNICAL FIELD

The present disclosure relates to a flexible display panel, a display device and a bonding method thereof.

BACKGROUND

Flexible display technology is a research hotspot in the field of display technology in recent years, and will be widely applied in the civil field and the military field due to the advantages of being thinner, more vibration-proof and more portable. Flexible display may be defined as a substrate for manufacturing a display panel with a very thin flexible base, and can be bent to the radius of curvature of only a few centimeters or less without damage to the display function of the display panel.

In the manufacturing process of a flexible display device, a flexible substrate is fixed on a glass substrate at first, and then the subsequent manufacturing process of a flexible display panel is performed. The process is compatible with a device for manufacturing the conventional display panel. After the flexible display panel is manufactured, the flexible substrate is separated from the glass substrate; subsequently, a backing film is attached to the rear of the flexible substrate for the smoothing of the flexible substrate; and finally, chip on film (COF) bonding and other processes are performed.

The flexible display panel separated from the glass substrate is usually thin. In the process of attaching the backing film, the flexible display panel is subject to a slight change in size due to force. In the subsequent COF bonding process, as pads on the COF are relatively dense and sensitive to size change, the size change of the flexible display panel will result in the problems such as misalignment and broken circuit between pads on the flexible display panel and pads on the COF, so that the yield can be affected.

SUMMARY

An embodiment of the disclosure provides a flexible display panel, comprising: a plurality of fan-out leads arranged along a first direction and disposed in a fan-out region, wherein the fan-out region is divided into a central region and lateral regions disposed on both sides of the central region in the first direction; virtual extension lines of the fan-out leads at least disposed in the lateral regions are intersected at a same junction point on a reference line perpendicular to the first direction; and the farther the fan-out leads in the lateral regions are away from the reference line, an angle between their virtual extension lines and the reference line is larger.

Another embodiment of the disclosure provides a display device, comprising: a flexible display panel and a chip on film (COF) bonded onto a fan-out region of the flexible display panel, wherein the fan-out region of the flexible display panel includes a plurality of fan-out leads arranged along a first direction; the fan-out region is divided into a central region and lateral regions disposed on both sides of the central region; virtual extension lines of the fan-out leads at least disposed in the lateral regions are intersected at a first junction point on a reference line perpendicular to the first direction; the farther the fan-out leads in the lateral regions are away from the reference line, an angle between their virtual extension lines and the reference line is larger; the COF includes a plurality of pads being arranged along the first direction and in one-to-one correspondence with the fan-out leads; virtual extension lines of the pads, which at least correspond to the fan-out leads disposed in the lateral regions, are intersected at a second junction point on the reference line; among the pads corresponding to the fan-out leads disposed in the lateral regions, the farther the pads are away from the reference line, an angle between their virtual extension lines and the reference line is larger; the pads and the fan-out leads in one-to-one correspondence are electrically connected by compression joint to form compression joint pairs; and an angle between the reference line and the virtual extension lines of the pad and the fan-out lead in each of the compression joint pair is the same.

Another embodiment of the disclosure provides a bonding method of the display device as mentioned above, comprising: aligning the flexible display panel and the COF according to a mode that the alignment marks in the first direction are disposed on the same straight line; performing compression joint on the pads and the fan-out leads in one-to-one correspondence after the alignment of the alignment marks, upon determining that a first distance between the two alignment marks on the flexible display panel in the first direction is equal to a second distance between the two alignment marks on the COF in the first direction; and performing compression joint on the pads and the fan-out leads in one-to-one correspondence after adjusting a relative position between the flexible display panel and the COF according to a deviation between the first distance and the second distance, upon determining that the first distance between the two alignment marks on the flexible display panel in the first direction is unequal to the second distance between the two alignment marks on the COF in the first direction.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The shape and the size of components in the accompanying drawings do not reflect the true scale of the display device and are only intended to illustrate the content of the present disclosure.

Figure 1A:
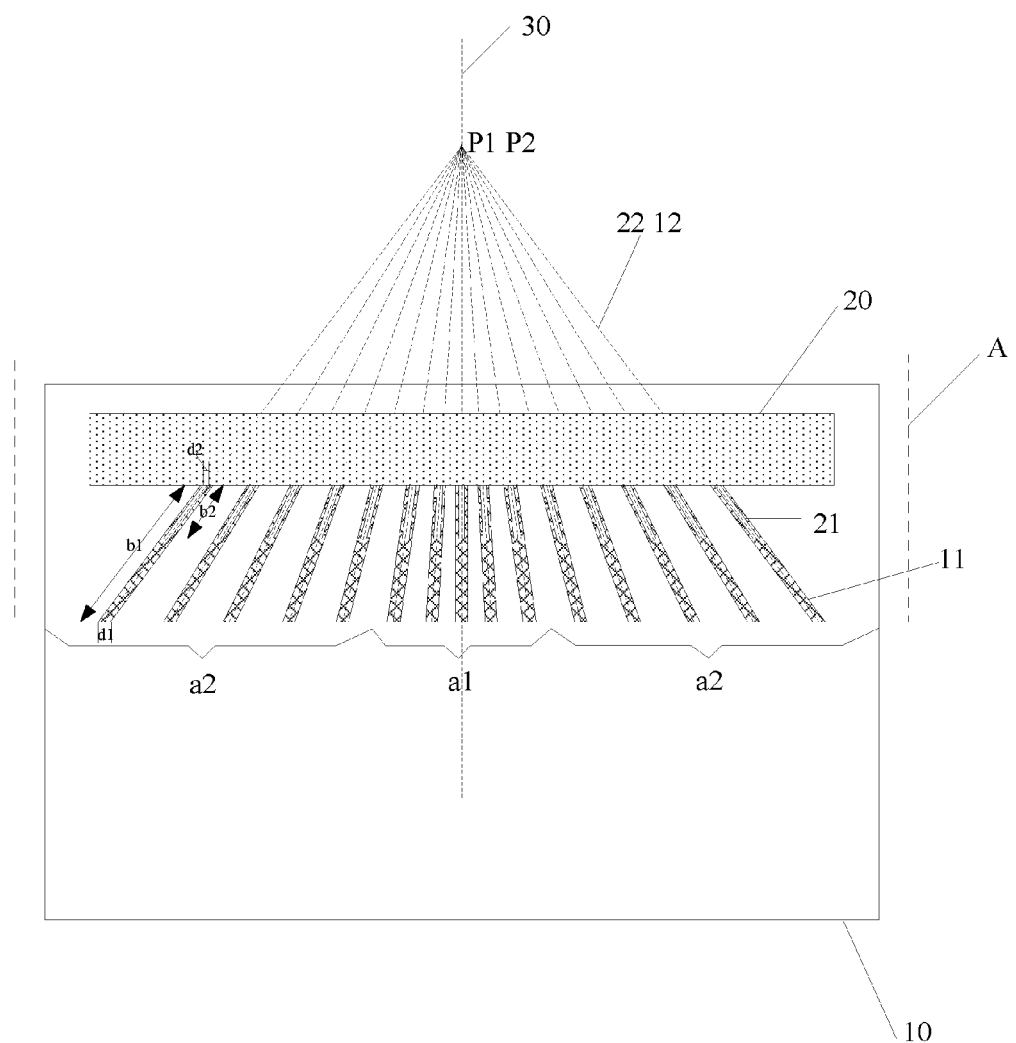
FIGS. 1a and 1b are respectively a schematic structural view of a display device provided by the embodiment of the present disclosure.
Figure 1B:
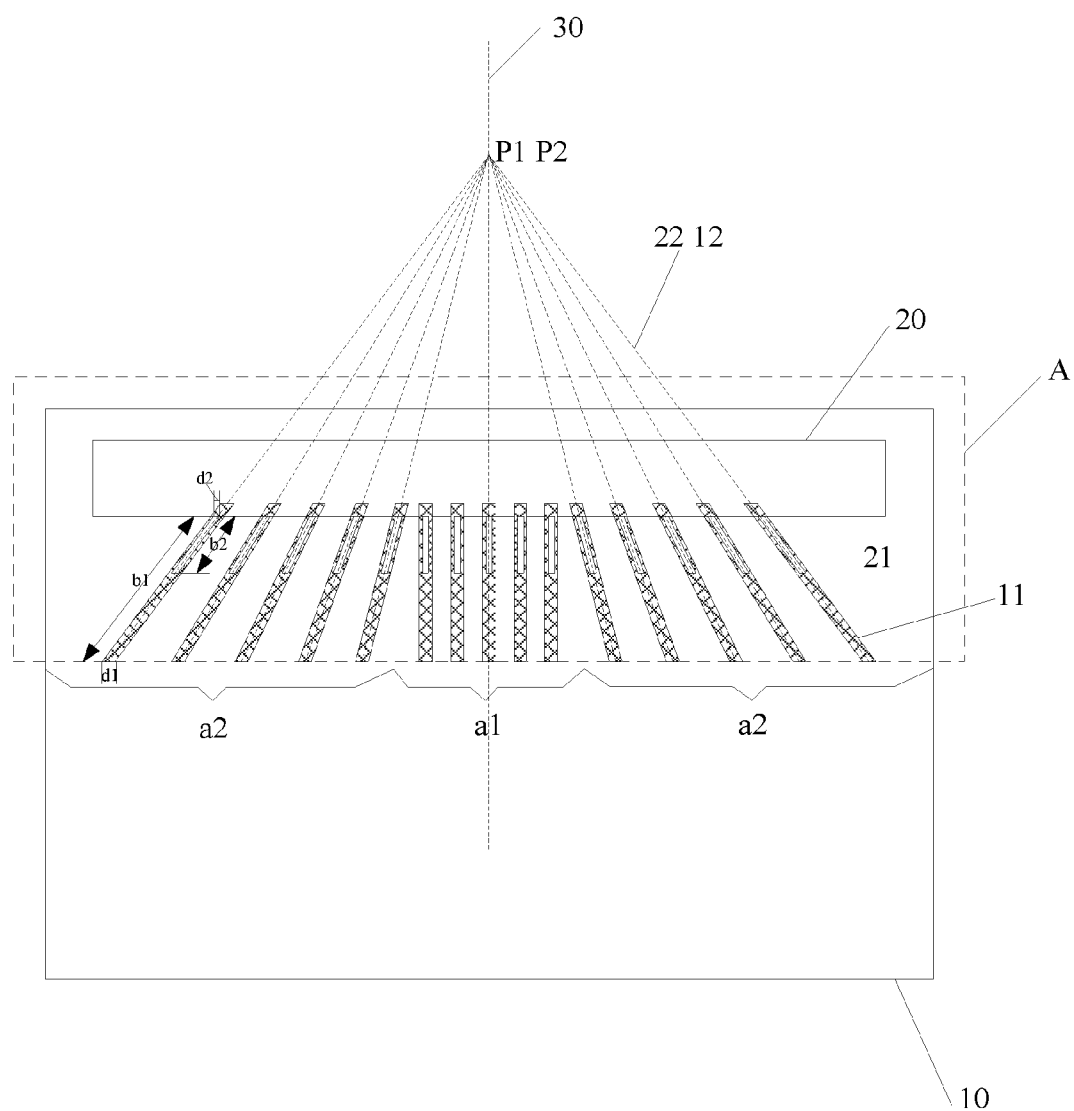

The embodiment of the present disclosure provides a display device, which, as illustrated in FIGS. 1a and 1b, comprises: a flexible display panel 10 and a chip on film (COF) 20 bonded onto a fan-out region A of the flexible display panel 10.

Figure 2A:
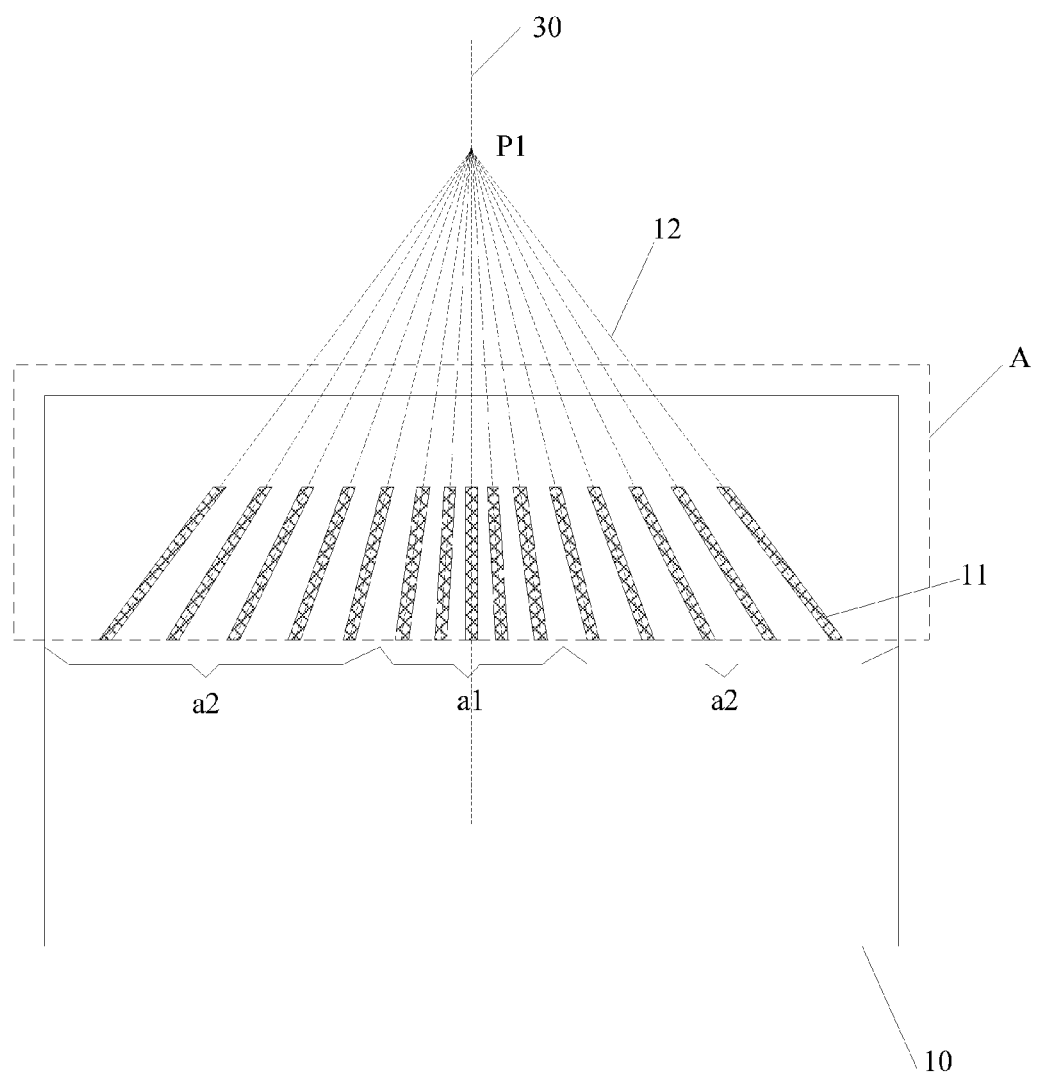
FIGS. 2a and 2b are respectively a schematic structural view of a flexible display panel provided by the embodiment of the present disclosure.
Figure 2B:
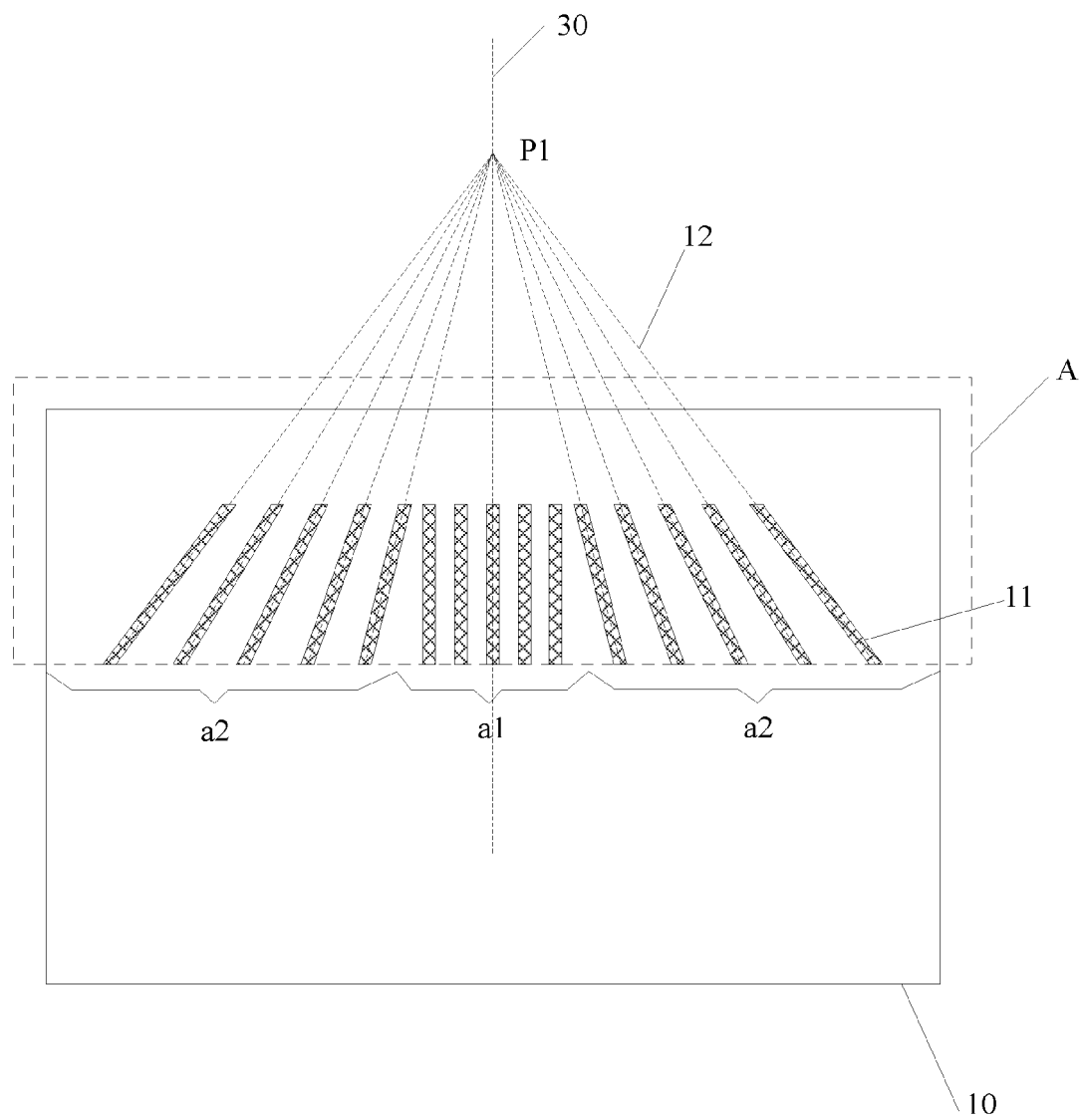

As illustrated in FIGS. 2a and 2b, the fan-out region A of the flexible display panel 10 includes a plurality of fan-out leads 11 arranged along a first direction; the fan-out region A is divided into a central region a1 and lateral regions a2 disposed on both sides of the central region a1; virtual extension lines 12 of the fan-out leads 11 at least disposed in the lateral regions a2 are intersected at a first junction point P1 on a reference line 30 perpendicular to the first direction; and the farther the fan-out leads 11 in the lateral regions a2 are away from the reference line 30, the angle between their virtual extension lines 12 and the reference line 30 is larger.

Fox example, the reference line runs through the central region. In some examples, the reference line runs through a center point of the central region in the first direction.

Figure 3A:
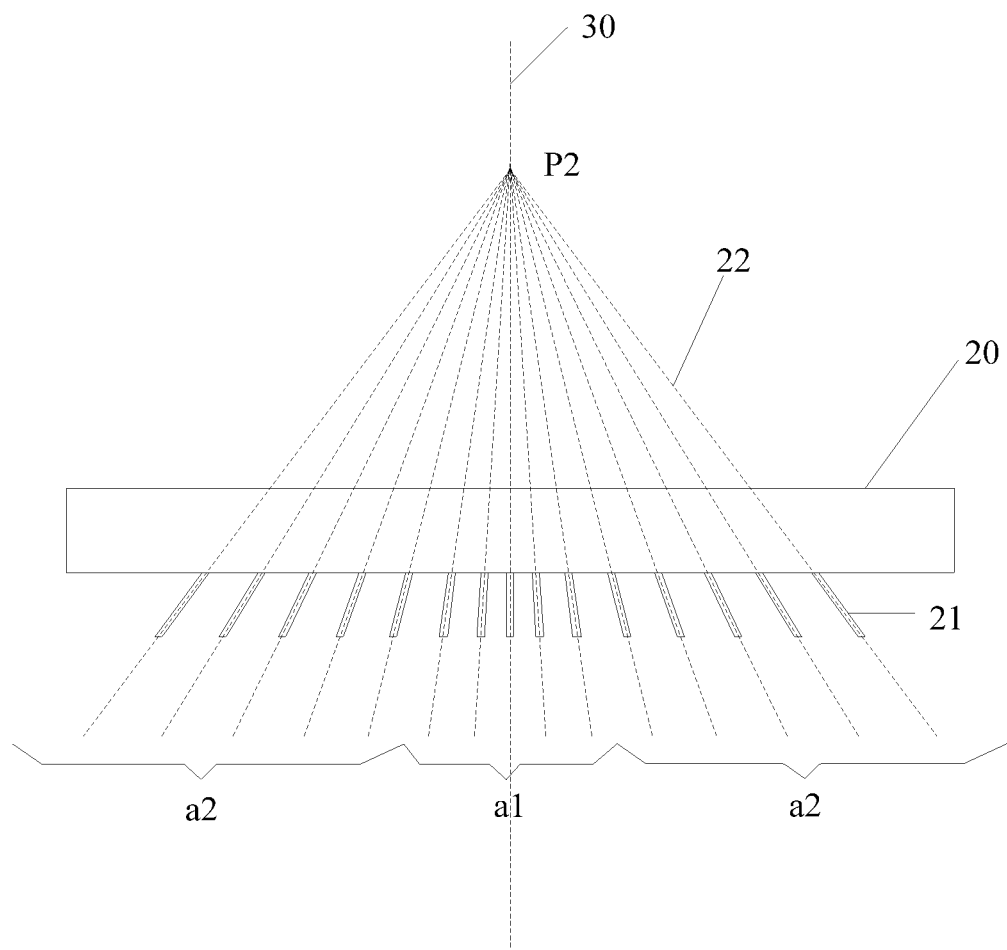
FIGS. 3a and 3b are respectively a schematic structural view of a COF in the display device provided by the embodiment of the present disclosure.
Figure 3B:
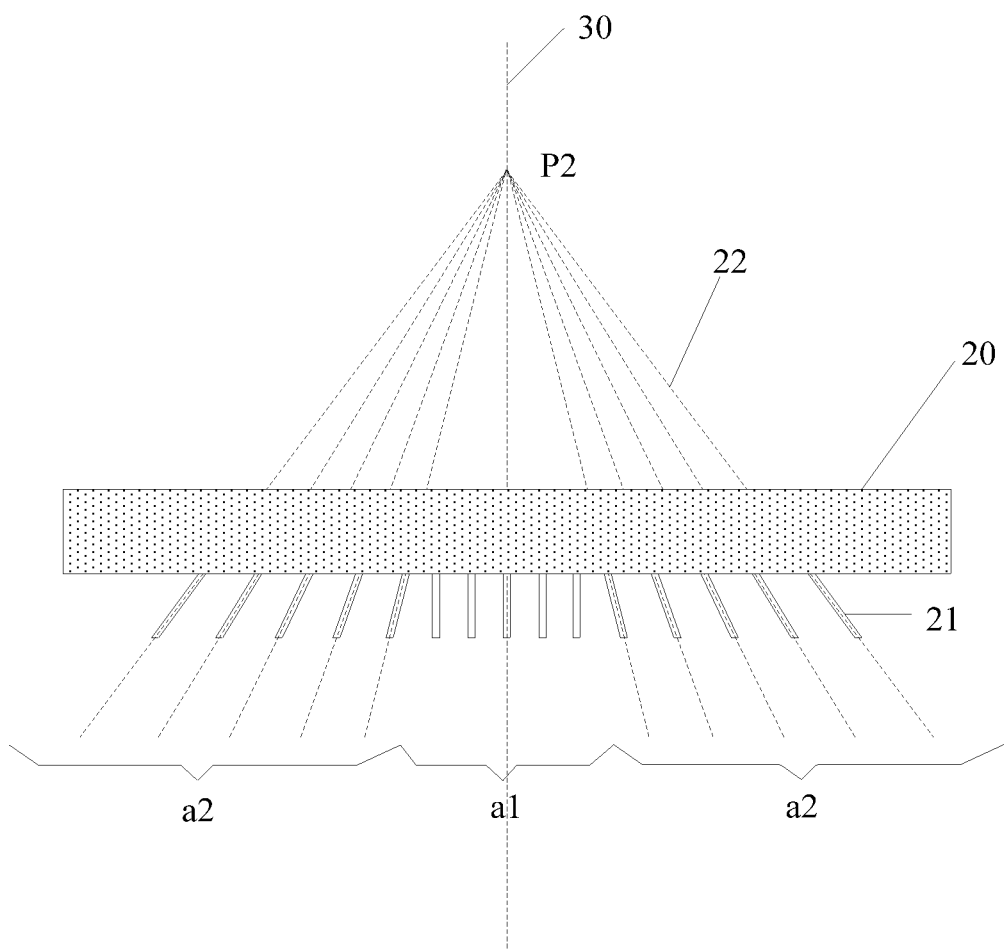

As illustrated in FIGS. 3a and 3b, the COF 20 includes a plurality of pads 21 being arranged along the first direction and in one-to-one correspondence with the fan-out leads 11; virtual extension lines 22 of the pads 21, which at least correspond to the fan-out leads 11 disposed in the lateral regions a2, are intersected at a second junction point P2 on the reference line 30; and among the pads 21 corresponding to the fan-out leads 11 disposed in the lateral regions a2, the farther the pads 21 are away from the reference line 30, the angle between their virtual extension lines 22 and the reference line 30 is larger.

As illustrated in FIGS. 1a and 1b, the pads 21 and the fan-out leads 11 in one-to-one correspondence are electrically connected by compression joint, and the angle between respective virtual extension lines 12 and 22 and the reference line 30 is the same, namely the virtual extension lines 22 of the pads 21 and the virtual extension lines 12 of the fan-out leads 11 in one-to-one correspondence are superimposed on each other. Fox example, the pads and the fan-out leads in one-to-one correspondence are electrically connected by compression joint to form compression joint pairs.

It should be noted that: the horizontal direction is taken as the first direction in FIGS. 1a to 3b; and after the bonding of the COF 20 and the flexible display panel 10, the junction points P1 and P2 are superimposed.

In the display device provided by the embodiment of the present disclosure, when the size of the flexible display panel 10 changes in the first direction, as both the pads 21 and the fan-out leads 11 in one-to-one correspondence in the lateral regions a2 have a certain inclination angle with respect to the reference line 30 and the angle between respective virtual extension lines 12 and 22 and the reference line 30 is the same, the flexible display panel 10 and the COF 20 may be bonded after the adjustment of the relative position of the flexible display panel 10 and the COF 20 in the direction perpendicular to the first direction, in the bonding process. Thus, the correct alignment of the pads 21 of the COF 20 and the fan-out leads 11 of the flexible display panel 10 can be achieved as long as the size change in the first direction is guaranteed to be within a certain range, so that the bonding yield and the reliability of the display device can be improved.

Moreover, in the display device provided by the embodiment of the present disclosure, one end of the fan-out lead 11 in the flexible display panel 10 is connected with a signal line in a display region, and the other end is directly connected with the pad 21 of the COF, so a fan-out lead connected with the fan-out lead 11 is not required to be disposed in the flexible display panel 10, and the fan-out lead 11 is directly connected with the pad 21 of the COF 20. Thus, the patterning complexity of the flexible display panel 10 can be simplified.

In some examples, compared with the central region, the size of the lateral region is easier to change, namely be deformed, when the flexible display panel 10 is under the action of a force. Thus, when the fan-out leads 11 and the pads 21 are correspondingly disposed on the flexible display panel 10 and the COF 20, the fan-out leads 11 and the pads 21 may be disposed on the left and the right of a central axis according to the reference line 30, so that the inclination angle of the fan-out leads 11 and the pads 21, at positions that are farther away from the central axis, with respect to the reference line 30 is larger. Fox example, in the display device provided by the embodiment of the present disclosure, as illustrated in FIGS. 1a to 3b, the fan-out leads 11 and the pads 21 are symmetrically distributed relative to the reference line 30.

Moreover, in order to ensure the uniformity of the bonding effect by allowing the fan-out leads 11 and the pads 21 to always have the same overlapping area in the process of adjusting the relative position of the flexible display panel 10 and the COF 20 in the direction perpendicular to the horizontal direction, in the display device provided by the embodiment of the present disclosure, as illustrated in FIGS. 1a and 1b, for the fan-out leads 11 and the pads 21 in one-to-one correspondence, the length b1 of the fan-out leads 11 in the direction of the virtual extension lines 12 is greater than the length b2 of the pads 21 in the direction of the virtual extension lines 22.

Moreover, in order to ensure the reliability of bonding by guaranteeing the correct alignment between the fan-out leads 11 and the pads 21 in the case of slight change in size of the flexible display panel 10 in the horizontal direction, in the display device provided by the embodiment of the present disclosure, as illustrated in FIGS. 1a and 1b, for the fan-out leads 11 and the pads 21 in one-to-one correspondence, the width d1 of the fan-out leads 11 in one-to-one correspondence in the first direction is greater than the width d2 of the pads 21 in the first direction.

In some examples, as the flexible display panel 10 is prone to deformation in the lateral regions a2 and has relatively small deformation in the central region a1, for example, in the display device provided by the embodiment of the present disclosure, as illustrated in FIG. 1b, the virtual extension lines 12 of the fan-out leads 11 disposed in the central region a1 are parallel to the reference line 30. Thus, the area of the fan-out region can be reduced. Correspondingly, the virtual extension lines 22 of the pads 21 corresponding to the fan-out leads 11 disposed in the central region a1 are parallel to the reference line 30.

Or in some examples, in the display device provided by the embodiment of the present disclosure, as illustrated in FIG. 1a, the fan-out leads 11 in the central region a1 and the lateral regions a2 are the same, namely virtual extension lines 12 of the fan-out leads 11 disposed in the central region a1 are intersected at the first junction point P1; and accordingly, virtual extension lines 22 of the pads 21 corresponding to the fan-out leads 11 disposed in the central region a1 are intersected at the second junction point P2.

Moreover, in the display device provided by the embodiment of the present disclosure, in order to satisfy the requirement of a large number of signal channels in high-resolution products, the pads 21 may also be respectively arranged in two rows on the COF 20, and the virtual extension lines 22 of the pads 21 respectively disposed on two rows are alternately distributed. At this point, double-layer metal leads may be adopted on the COF 20 to respectively connect the two rows of pads 21 to a chip.

Based on the same invention concept, the embodiment of the present disclosure further provides a flexible display panel, which, as illustrated in FIGS. 2a and 2b, comprises: a plurality of fan-out leads 11 arranged along a first direction and disposed in a fan-out region A, wherein the fan-out region A is divided into a central region a1 and lateral regions a2 disposed on both sides of the central region a1; virtual extension lines 12 of the fan-out leads 11 at least disposed in the lateral regions a2 are intersected at the same junction point P1 on a reference line 30 perpendicular to the first direction; and the farther the fan-out leads 11 in the lateral regions a2 are away from the reference line 30, the angle between their virtual extension lines 12 and the reference line 30 is larger.

When the size of the flexible display panel 10 provided by the embodiment of the present disclosure changes in the first direction, as all the fan-out leads 11 in the lateral regions a2 have a certain inclination angle with respect to the reference line 30, the flexible display panel 10 and the COF 20 may be bonded after the adjustment of the relative position of the flexible display panel 10 and the COF 20 in the direction perpendicular to the first direction, in the bonding process. Thus, the correct alignment of the pads 21 of the COF 20 and the fan-out leads 11 of the flexible display panel 10 can be achieved as long as the size change in the first direction is guaranteed to be within a certain range, so that the bonding yield and the reliability of the display device can be improved.

Moreover, one end of the fan-out lead 11 in the flexible display panel 10 provided by the embodiment of the present disclosure is connected with a signal line in a display region, and the other end is directly connected with the pad 21 of the COF, so a fan-out lead connected with the fan-out lead 11 is not required to be disposed in the flexible display panel 10, and the fan-out lead 11 is directly connected with the pad 21 of the COF 20. Thus, the patterning complexity of the flexible display panel 10 can be simplified.

In some examples, compared with the central region, the size of the lateral region is easier to change, namely be deformed, when the flexible display panel 10 is under the action of a force. Thus, when the fan-out leads 11 are correspondingly disposed on the flexible display panel 10, the fan-out leads 11 may be disposed on the left and the right of a central axis according to the reference line 30, so that the inclination angle of the fan-out leads 11, at positions that are farther away from the central axis, with respect to the reference line 30 is larger. Fox example, in the flexible display panel provided by the embodiment of the present disclosure, as illustrated in FIGS. 2a and 2b, the fan-out leads 11 are symmetrically distributed relative to the reference line 30.

In some examples, as the flexible display panel 10 is prone to deformation in the lateral regions a2 and has relatively small deformation in the central region a1, for example, in the flexible display panel provided by the embodiment of the present disclosure, as illustrated in FIG. 2b, the virtual extension lines 12 of the fan-out leads 11 disposed in the central region a1 are parallel to the reference line 30. Thus, the area of the fan-out region can be reduced.

Or in some examples, in the display device provided by the embodiment of the present disclosure, as illustrated in FIG. 2a, the fan-out leads 11 in the central region a1 and the lateral regions a2 are the same, namely virtual extension lines 12 of the fan-out leads 11 disposed in the central region a1 are intersected at the first junction point P1.

Fox example, in the display device, alignment marks are respectively formed on the flexible display panel and the COF, so as to align the COF and the flexible display panel during bonding. In some examples, the flexible display panel includes two first alignment marks respectively disposed at center points of two fan-out leads symmetrical relative to the reference line in the lateral regions, and the two first alignment marks are disposed on the same straight line along the first direction (as illustrated by m1 and m2 in FIG. 5). In some examples, the COF includes two second alignment marks respectively disposed at center points of two pads symmetrical relative to the reference line in the lateral regions; the two second alignment marks are disposed on the same straight line along the first direction (as illustrated by n1 and n2 in FIG. 5); and the two pads respectively correspond to the two fan-out leads.

Fox example, in the description, the correspondence of the fan-out lead and the pad indicates that the fan-out lead and the pad are to be or have been subjected to compression joint.

Figure 4:
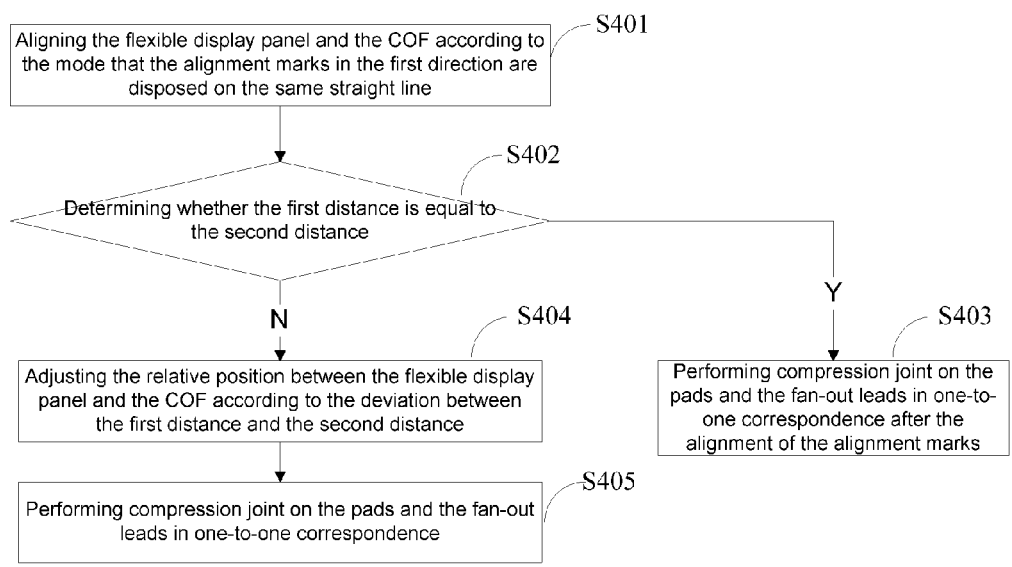
FIG. 4 is a flow diagram of a bonding method of the display device, provided by the embodiment of the present disclosure.

On the basis of the same invention concept, the embodiment of the present disclosure further provides a bonding method of the display device, which, as illustrated in FIG. 4, may comprise the following steps.

Figure 5:
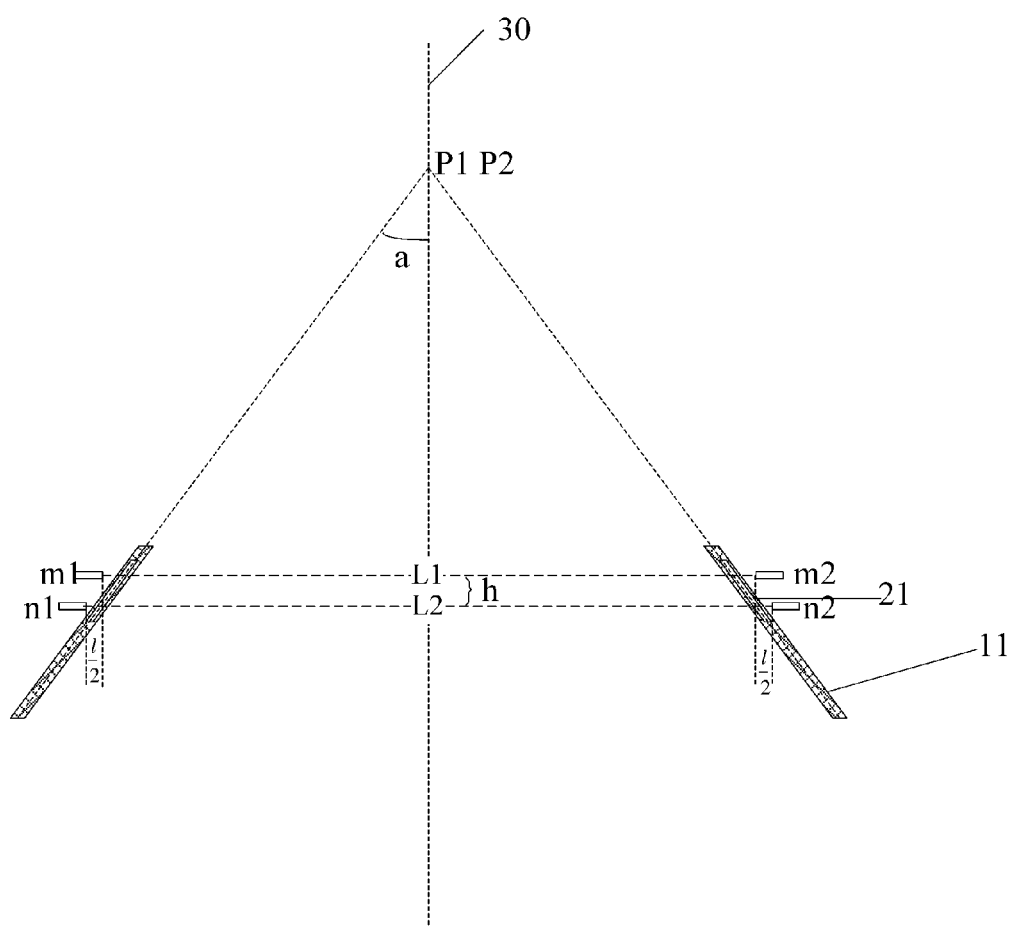
FIG. 5 is a schematic diagram of the bonding method of the display device, provided by the embodiment of the present disclosure.

S401: aligning the flexible display panel and the COF according to the mode that the alignment marks m1, m2, n1 and n2 in the first direction are disposed on the same straight line, as illustrated in FIG. 5.

S402: as illustrated in FIG. 5, determining whether the first distance L1 between the two alignment marks m1 and m2 on the flexible display panel in the first direction is equal to the second distance L2 between the two alignment marks n1 and n2 on the COF in the first direction; executing the step S403 if the first distance is equal to the second distance; and executing the step S404 if not.

S403: performing compression joint on the pads and the fan-out leads in one-to-one correspondence after the alignment of the alignment marks.

S404: adjusting the relative position between the flexible display panel and the COF according to the deviation between the first distance L1 and the second distance L2.

S405: performing compression joint on the pads 21 and the fan-out leads 11 in one-to-one correspondence.

Fox example, in the bonding method provided by the embodiment of the present disclosure, as illustrated in FIG. 5, the step of adjusting the relative position between the flexible display panel and the COF according to the deviation between the first distance L1 and the second distance L2 in the step S404 includes:

adjusting the displacement between the flexible display panel and the COF in the first direction according to the deviation between centers of the first distance L1 and the second distance L2; and determining the adjustment of the displacement h between the flexible display panel and the COF in the direction of the reference line according to the following formula:

$$h = \frac{l \cdot \cot a}{2}$$

wherein, l represents the deviation between the first distance and the second distance, and a represents the angle between the reference line 30 and the virtual extension line of the pad 21 provided with the alignment mark. Description is given in FIG. 5 by only taking one row of fan-out leads 11 and pads 21 provided with alignment marks as an example.

Fox example, FIG. 5 is a schematic diagram of the display device obtained after the movement according to the displacement h under the condition of unequal first distance L1 and second distance L2. As can be seen from FIG. 5, the fan-out leads and the pads are in one-to-one correspondence and hence can be subjected to compression joint.

When both the flexible display panel and the COF are in ideal state, during the compression joint of the fan-out leads and the corresponding pads, the alignment marks m1 and m2 are respectively superimposed with the alignment marks n1 and n2. If the size of at least one of the flexible display panel or the COF is varied, the distance between m1 and m2 may be not equal to the distance between n1 and n2. At this point, the superimposition and the compression joint of the fan-out leads and the pads, corresponding to each other, can be achieved according to the method provided by the present disclosure.

In the flexible display panel, the display device and the bonding method thereof, provided by the embodiment of the present disclosure, the flexible display panel includes a plurality of fan-out leads arranged along a first direction and disposed in a fan-out region; the fan-out region is divided into a central region and lateral regions disposed on both sides of the central region; virtual extension lines of the fan-out leads at least disposed in the lateral regions are intersected at a first junction point on a reference line perpendicular to the first direction; a COF includes a plurality of pads being arranged along the first direction and in one-to-one correspondence with the fan-out leads; and virtual extension lines of the pads, which at least correspond to the fan-out leads disposed in the lateral regions, are intersected at a second junction point on the reference line. Thus, when the size of the flexible display panel changes along the first direction, due to the same angle between the reference line and respective virtual extension lines of the pads and the fan-out leads in one-to-one correspondence, the flexible display panel and the COF may be bonded after the adjustment of the relative position of the flexible display panel and the COF in the direction perpendicular to the first direction, in the bonding process. Thus, the correct alignment of the pads of the COF and the fan-out leads of the flexible display panel can be achieved as long as the size change in the first direction is guaranteed to be within a certain range, so that the bonding yield and the reliability of the display device can be improved.

The foregoing is merely exemplary embodiments of the invention, but is not used to limit the protection scope of the invention. The protection scope of the invention shall be defined by the attached claims.

The application claims priority to the Chinese patent application No. 201610080509.0, filed Feb. 4, 2016, the entire disclosure of which is incorporated herein by reference as part of the present application.

The invention claimed is:

1. A display device, comprising: a flexible display panel and a chip on film (COF) bonded onto a fan-out region of the flexible display panel, wherein
the fan-out region of the flexible display panel includes a plurality of fan-out leads arranged along a first direction; the fan-out region is divided into a central region and lateral regions disposed on both sides of the central region; virtual extension lines of the fan-out leads at least disposed in the lateral regions are intersected at a first junction point on a reference line perpendicular to the first direction; the farther the fan-out leads in the lateral regions are away from the reference line, an angle between their virtual extension lines and the reference line is larger;
the COF includes a plurality of pads being arranged along the first direction and in one-to-one correspondence with the fan-out leads; virtual extension lines of the pads, which at least correspond to the fan-out leads disposed in the lateral regions, are intersected at a second junction point on the reference line; among the pads corresponding to the fan-out leads disposed in the lateral regions, the farther the pads are away from the reference line, an angle between their virtual extension lines and the reference line is larger;
the pads and the fan-out leads in one-to-one correspondence are electrically connected by compression joint to form compression joint pairs; and an angle between the reference line and the virtual extension lines of the pad and the fan-out lead in each of the compression joint pair is the same,
wherein the virtual extension lines of the fan-out leads disposed in the central region are parallel to the reference line; and the virtual extension lines of the pads corresponding to the fan-out leads disposed in the central region are parallel to the reference line,
wherein, in each compression joint pair disposed in the center region and the lateral regions, a width of the fan-out lead in the first direction is greater than a width of the pad in the first direction, in each compression joint pair, a length of the fan-out lead in a direction of the reference line is greater than a length of the pad in the direction of the reference line and an orthographic projection of the pad on the flexible display panel is completely within an orthographic projection of the fan-out lead on the flexible display panel.

2. The display device according to claim 1, wherein the fan-out leads and the pads are symmetrically distributed relative to the reference line, respectively.

3. The display device according to claim 1, wherein the reference line runs through the central region.

4. The display device according to claim 3, wherein the reference line runs through a center point of the central region in the first direction.

5. The display device according to claim 1, wherein the flexible display panel includes two first alignment marks respectively disposed at center points of two fan-out leads symmetrical relative to the reference line in the lateral regions; and the two first alignment marks are disposed on a same straight line along the first direction.

6. The display device according to claim 5, wherein the COF includes two second alignment marks respectively disposed at center points of two pads symmetrical relative to the reference line in the lateral regions; the two second alignment marks are disposed on a same straight line along the first direction; and the two pads respectively correspond to the two fan-out leads.

7. A bonding method of the display device according to claim 1, comprising:
aligning the flexible display panel and the COF according to a mode that alignment marks in the first direction are disposed on the same straight line;
performing compression joint on the pads and the fan-out leads in one-to-one correspondence after the alignment of the alignment marks, in a first case that a first distance between two alignment marks on the flexible display panel in the first direction is equal to a second distance between two alignment marks on the COF in the first direction; and
performing compression joint on the pads and the fan-out leads in one-to-one correspondence after adjusting a relative position between the flexible display panel and the COF according to a deviation between the first distance and the second distance, in a second case that the first distance between the two alignment marks on the flexible display panel in the first direction is unequal to the second distance between the two alignment marks on the COF in the first direction.

8. The method according to claim 7, wherein adjusting the relative position between the flexible display panel and the COF according to the deviation between the first distance and the second distance includes:
adjusting a displacement between the flexible display panel and the COF in the first direction according to the deviation between centers of the first distance and the second distance; and
determining the adjustment of the displacement h between the flexible display panel and the COF in the direction of the reference line according to the following formula:

$$h = \frac{l \cdot \cot a}{2}$$

wherein, l represents the deviation between the first distance and the second distance, and a represents the angle between the reference line and the virtual extension line of the pad provided with the alignment mark.

* * * * *